United States Patent
Byrne et al.

(10) Patent No.: US 6,917,251 B2
(45) Date of Patent: Jul. 12, 2005

(54) SYSTEM AND METHOD FOR SUPPRESSING RADIO FREQUENCY (RF) RADIATION

(75) Inventors: Daniel Joseph Byrne, Ft. Collins, CO (US); Amol Subhash Pandit, Greeley, CO (US); Mark Nelson Robins, Greeley, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 26 days.

(21) Appl. No.: 10/602,983

(22) Filed: Jun. 24, 2003

(65) Prior Publication Data

US 2004/0263276 A1 Dec. 30, 2004

(51) Int. Cl.$^7$ .............................. H01P 1/23; H03H 7/00
(52) U.S. Cl. .................................. 333/12; 333/181
(58) Field of Search ........................ 333/12, 167, 169, 333/172, 174, 178, 179, 181, 185; 336/229

(56) References Cited

U.S. PATENT DOCUMENTS 6,127,903 A * 10/2000 Foley .......................... 333/181
6,137,379 A * 10/2000 Morrill ........................ 333/169
6,141,571 A * 10/2000 Dionne ....................... 505/210

FOREIGN PATENT DOCUMENTS

| GB | 2063573 | 6/1981 |
| JP | 60106060 | 6/1985 |
| JP | 06112048 | 4/1994 |
| JP | 07201579 | 8/1995 |
| JP | 2001313216 | 11/2001 |

* cited by examiner

*Primary Examiner*—Robert Pascal
*Assistant Examiner*—Dean Takaoka (57) ABSTRACT

An adjustable filter for suppressing radio frequency emission is disclosed. The adjustable filter comprises a ferrite material inductively coupled to a signal carrier, the signal carrier having current at a first frequency and a second frequency, and a signal carrier having an adjustable inductance for adjusting the electrical characteristics of the signal carrier. Adjusting the electrical characteristics of the signal carrier reduces saturation of the ferrite material at the first frequency, thereby allowing the ferrite material to suppress current at the second frequency, where the second frequency is higher than the first frequency.

23 Claims, 6 Drawing Sheets

SYSTEM AND METHOD FOR SUPPRESSING RADIO FREQUENCY (RF) RADIATION

BACKGROUND

Many electronic devices, regardless of application, include system timing clocks and other high-speed components that can produce electromagnetic radiation. Electromagnetic radiation emitted from an electronic device can interfere with other devices in the vicinity of the electronic device. For example, electromagnetic radiation in the radio frequency (RF) spectrum is referred to as RF radiation and can result in RF interference (RFI) when it interferes with electronic devices located in the vicinity of the emitting device. The radio frequency radiation emitted from an electronic device can be a complex mixture of high and low frequencies, their associated harmonics, as well as broadband noise.

To control and regulate the amount of radio frequency radiation emitted by an electronic device, regulatory agencies and certification authorities have developed limits of allowable emissions under which all electronic devices must remain. For example, the Federal Communication Commission (FCC) determines maximum radio frequency radiation limits for electronic devices sold in the United States. Manufacturers of electronic devices are required to make their products comply with such regulations. Unfortunately, as clock frequencies and operating frequencies of electronic devices continue to increase, frequently so does the amount of radio frequency radiation emitted by these devices. When a device is compliance tested it is required that all connectors and cables that are provided with the device be connected to the device. At high frequencies, these connectors and cables tend to behave as transmission lines or antennas. Thus, connectors and cables facilitate the emission of radio frequency radiation. The electrical behavior of cables is modeled by distributed inductance and capacitance.

Electronic signals are frequently referred to as either "common-mode" or "differential-mode." Common-mode can be defined as the instantaneous algebraic average of two signals applied to a balanced circuit, where both signals are referred to a common reference. Differential-mode can be defined as the instantaneous algebraic difference between two signals applied to a balanced circuit, where both signals are referred to a common reference. The signals may be either voltages or currents.

Figure 1:
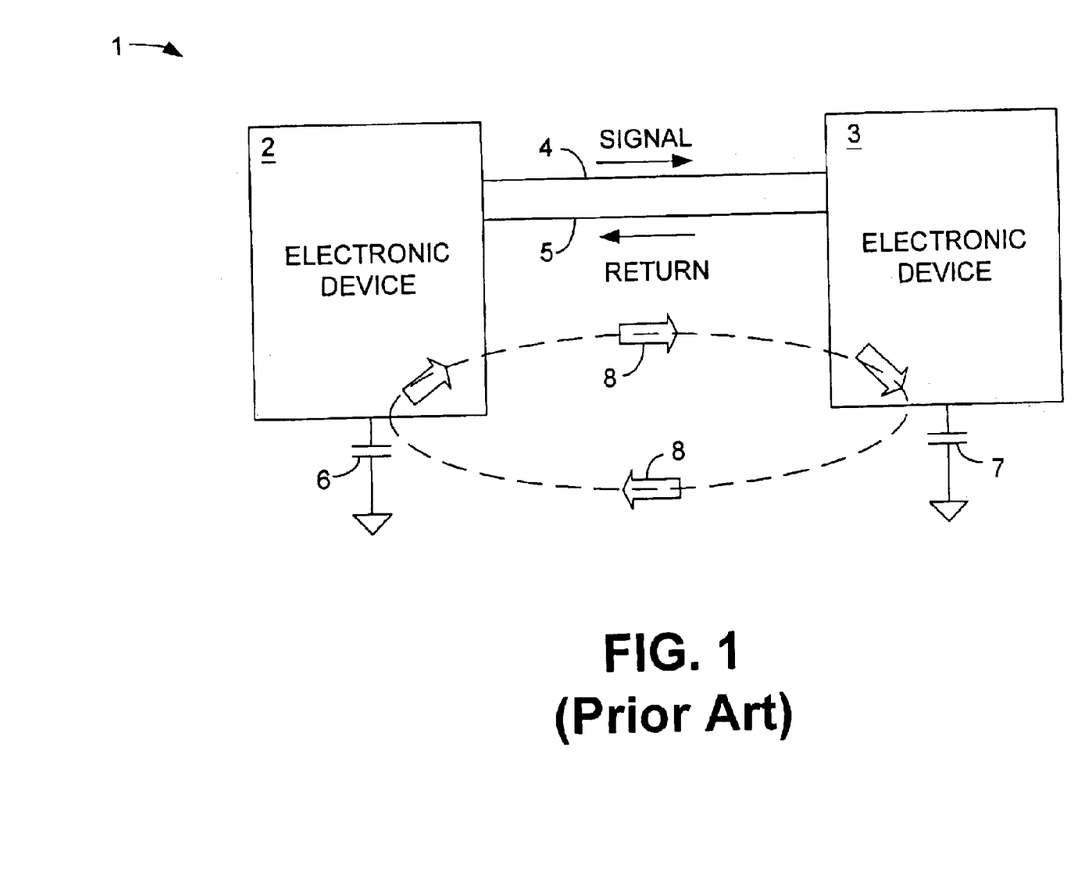
FIG. 1 is a schematic diagram illustrating differential-mode and common-mode signals.

FIG. 1 is a schematic diagram 1 illustrating differential-mode and common-mode signals. The diagram 1 includes an electronic device 2 coupled to another electronic device 3 via an interconnect cable, illustrated using a pair of conductors 4 and 5. For purposes of illustration, conductor 4 carries a signal and conductor 5 provides a return path for the signal. The signal carried in the conductors 4 and 5 is considered differential mode if the net sum of the currents in conductors 4 and 5 is equal to zero. Unfortunately, an interconnect system as shown in FIG. 1 frequently includes a parasitic capacitance associated with each electronic device. The parasitic capacitance associated with electronic device 2 is illustrated using capacitive element 6 and the parasitic capacitance associated with electronic device 3 is illustrated using capacitive element 7. The capacitive elements 6 and 7 couple the electronic devices 2 and 3, respectively, to ground. The parasitic capacitances 6 and 7 provide an alternative path between electronic devices 2 and 3. This alternative path allows undesirable current to flow between the electronic devices 2 and 3. The undesirable current is illustrated using arrows 8 and is referred to as a common-mode current. The common-mode current can give rise to radio frequency radiation. The common-mode current may be attenuated by attaching what is referred to as a "common-mode filter" to the cable carrying the conductors 4 and 5. A common-mode filter is typically a toroidal shaped ferrite device. Such a device provides lossy attenuation of the common-mode current, while not inductively loading the differential-mode signal in the cable. The ability of such a ferrite device to attenuate the unwanted common-mode current (and therefore reduce unwanted radio frequency radiation) while not degrading the differential-mode signal is largely a function of the material from which the ferrite device is constructed and the geometry of the device.

The effectiveness of a ferrite-based device at suppressing radio frequency radiation is limited by the net current passing through the ferrite device. Large amplitude, low-frequency signals may easily bias, or saturate, a ferrite device so that it becomes ineffective at other frequencies. This situation becomes more problematic when attempting to suppress radio frequency radiation on a single conductor, where the net current on the conductor is non-zero.

Figure 2A:
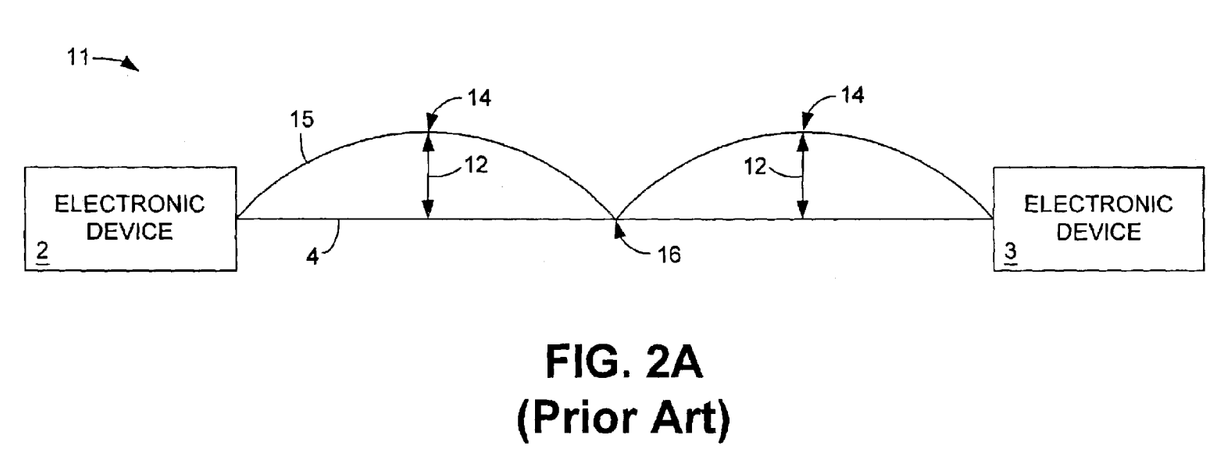
FIGS. 2A and 2B are graphical illustrations depicting the limitations of a conventional ferrite-based device at suppressing radio frequency radiation occurring at more than one frequency.
Figure 2B:
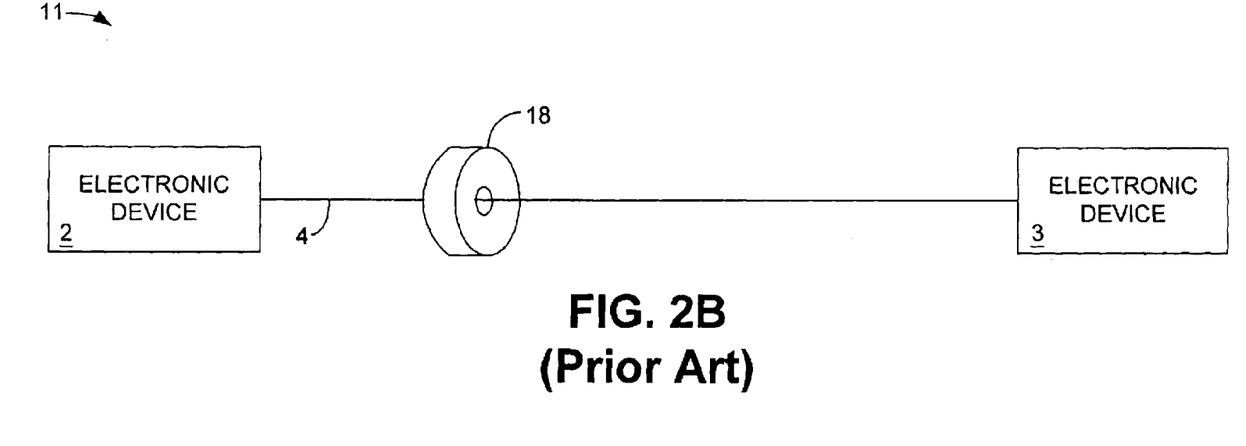

FIGS. 2A and 2B are graphical illustrations depicting the limitations of a conventional ferrite-based device at suppressing radio frequency emission occurring at more than one frequency. In FIG. 2A a current at a frequency of $f_0$ is represented on the conductor 4 using time-varying trace 15. The trace 15 includes a node 16 at which the current at frequency $f_0$ is zero and anti-nodes 14 at which the current amplitude is at a maximum, represented by the arrows 12. The current amplitude of the trace 15 is represented as a function of position along the conductor 4 at a frequency $f_0$. In FIG. 2B, a conventional ferrite device 18 is located on the conductor 4 at an anti-node 14, which coincides with the maximum current amplitude of the frequency $f_0$ carried in the conductor 4. Unfortunately, this placement of the ferrite device 18 is sub-optimal for suppressing radio frequency emissions at a frequency of $f_1$, where $f_1$ is greater than $f_0$ because the ferrite device 18 tends to saturate with the current generated by the signal at frequency $f_0$. This causes the ferrite device 18 to become ineffective at suppressing radio frequency emissions at a frequency of $f_1$, where $f_1$ is greater than $f_0$.

Figures 3A, 3B:
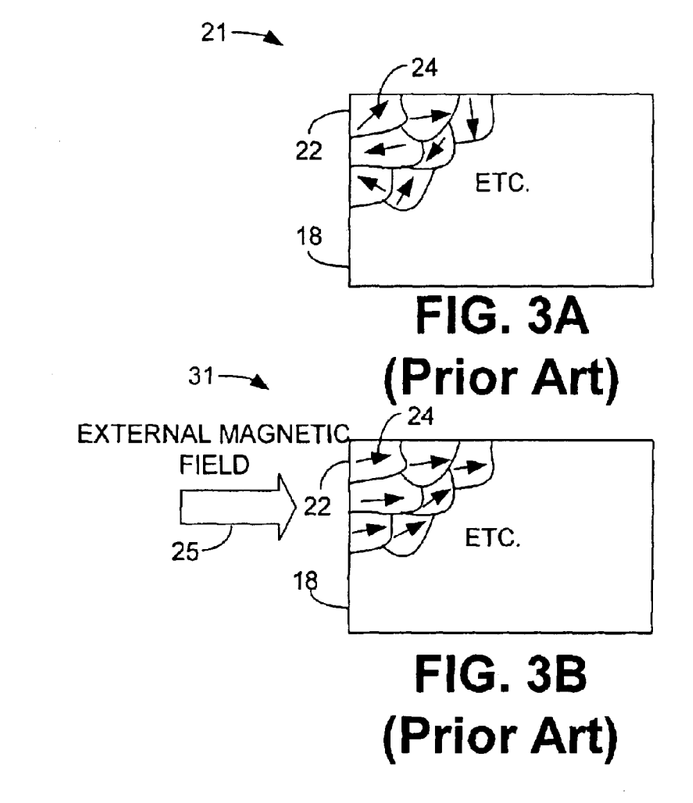
FIGS. 3A and 3B are block diagrams illustrating the saturation of a ferrite device.

FIGS. 3A and 3B are block diagrams illustrating the saturation of a ferrite device. FIG. 3A illustrates a ferrite device 18 in an unsaturated condition. The ferrite device 18 is typically fabricated of a compound including iron oxide and includes a plurality of micro-domains, an exemplary one of which is illustrated using reference numeral 22. In an unsaturated condition (i.e., in the absence of an external magnetic field created by current in the conductor4), the micro-domains are randomly oriented, as illustrated using arrows 24.

In FIG. 3B, an external field caused by current in the conductor 4 and illustrated using arrow 25 is applied to the ferrite device 18. The external field 25 causes the boundaries in the micro-domains 22 to shift and the micro-domains to substantially align with each other, as illustrated with arrows 24 aligned in generally the same general direction. This alignment of the micro-domains results in an energy transfer from the conductor 4 to the ferrite device 18 at a particular frequency (i.e., at frequency $f_0$). The energy absorbed by the ferrite device 18 at frequency $f_0$ results in reduced radio frequency emission from the conductor 4 at frequency $f_0$. Unfortunately, the energy absorbed by the ferrite device 18 at frequency $f_0$ may saturate the ferrite device 18 and prevent the ferrite device from further absorbing energy from a conductor that also includes a higher frequency current, such as at a frequency $f_1$, where $f_1$ is greater than $f_0$.

Therefore, it would be desirable to have a way of enhancing the radio frequency radiation suppression characteristics of a ferrite device.

SUMMARY

A system and method for suppressing radio frequency radiation is disclosed. In one embodiment, the system and method for suppressing radio frequency radiation is a variable filter. The variable filter comprises a ferrite material inductively coupled to a signal carrier, the signal carrier having current at a first frequency and a second frequency. The signal carrier has a variable inductance for adjusting the electrical characteristics of the signal carrier. Adjusting the electrical characteristics of the signal carrier reduces saturation of the ferrite material at the first frequency, thereby allowing the ferrite material to suppress current at the second frequency, where the second frequency is higher than the first frequency.

Related methods of operation are also provided. Other systems, methods, features, and advantages of the invention will be or become apparent to one with skill in the art upon examination of the following figures and detailed description. It is intended that all such additional systems, methods, features, and advantages be included within this description, be within the scope of the system and method for suppressing radio frequency radiation, and be protected by the accompanying claims.

BRIEF DESCRIPTION OF THE DRAWINGS

The system and method for suppressing radio frequency radiation, as defined in the claims, can be better understood with reference to the following drawings. The components within the drawings are not necessarily to scale relative to each other, emphasis instead being placed upon clearly illustrating the principles of the present invention.

DETAILED DESCRIPTION

Embodiments of the system and method for suppressing radio frequency radiation described below are applicable to any device having a signal-carrying conductor that emits undesirable radio frequency radiation. The system and method for suppressing radio frequency radiation can be implemented solely in hardware, or, in an alternative embodiment, in a combination of hardware and software.

When implemented using a combination of hardware and software, the software is stored in a memory and is executed by a suitable instruction execution system. The hardware portion of the system and method for suppressing radio frequency radiation can be implemented with any or a combination of the following technologies, which are all well known in the art: a discrete logic circuit(s) having logic gates for implementing logic functions upon data signals, an application specific integrated circuit (ASIC) having appropriate combinational logic gates, a programmable gate array (s) (PGA), a field programmable gate array (FPGA), etc. The software portion of the system and method for suppressing radio frequency radiation can be stored in one or more memory elements and executed by a suitable general purpose or application specific processor.

The software for suppressing radio frequency radiation, which comprises an ordered listing of executable instructions for implementing logical functions, can be embodied in any computer-readable medium for use by or in connection with an instruction execution system, apparatus, or device, such as a computer-based system, processor-containing system, or other system that can fetch the instructions from the instruction execution system, apparatus, or device and execute the instructions.

Figures 4, 5, 6:
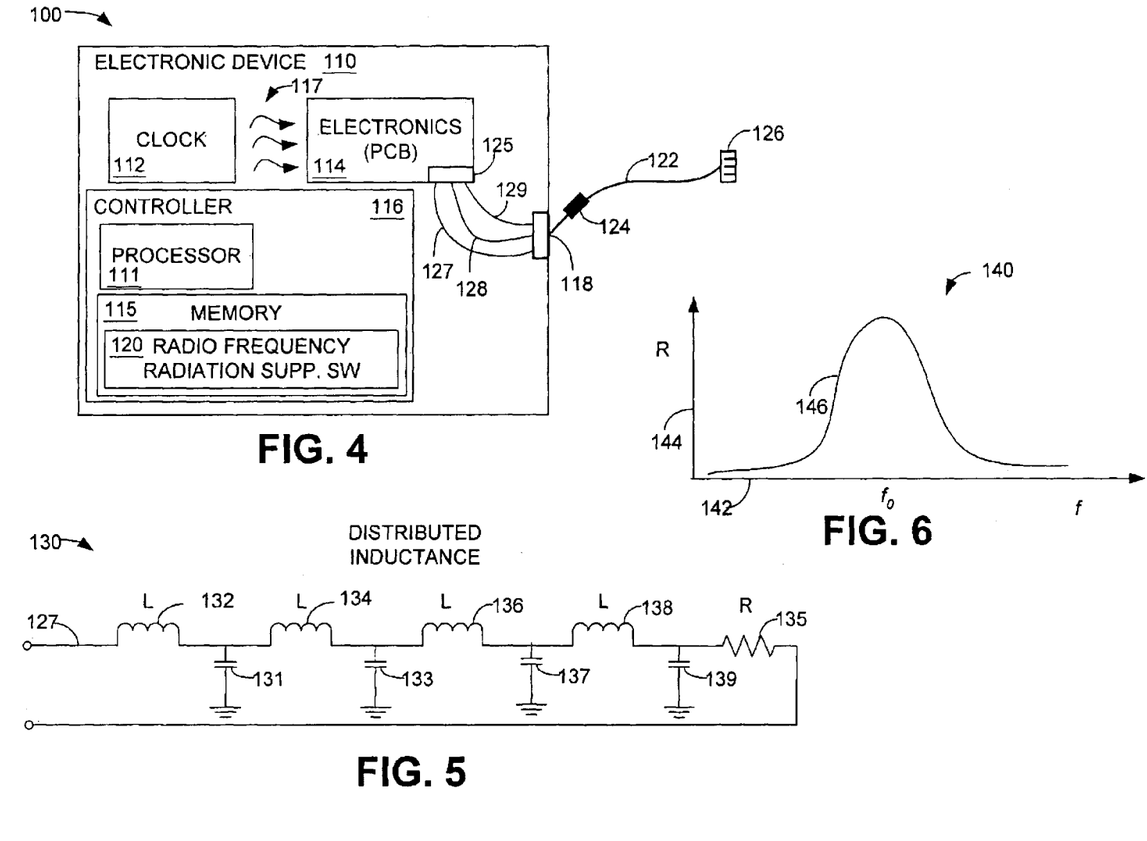
FIG. 4 is a block diagram illustrating an exemplary electronic device on which embodiments of the system and method for suppressing radio frequency radiation may be used to suppress radio frequency radiation.
FIG. 5 is a schematic diagram illustrating a theoretical circuit model of a conductor carrying a high-frequency signal.
FIG. 6 is a graphical illustration showing an example of filter impedance vs. frequency for the filter of FIG. 4.

FIG. 4 is a block diagram 100 illustrating an electronic device 110 on which embodiments of the invention may be implemented to minimize the level of radio frequency radiation emitted from a signal carrying conductor associated with the electronic device 110. The electronic device 110 can be any type of electronic device that includes a clock 112, or any other element, that emits a high-frequency signal that can be coupled into the electronics 114 and produce radio frequency radiation. The radio frequency radiation can result in radio frequency interference being generated by the electronics 114. In this example, the clock 112 operates at a frequency of $f_0$ that couples noise into the electronics 114 and any external devices coupled to the electronics 114. The electronics 114 can include, for example, integrated circuits and discrete inductive, capacitive, and resistive components. The coupling of the noise generated by the clock signal into the electronics 114 is indicated using reference numeral 117. The coupling of the clock signal noise into the electronics 114 may manifest in the electronics 114 and associated wiring as, for example, undesirable current at various harmonic multiples (e.g., $2_0$, $3_0$, $4_0$, etc.) of the clock frequency, $_0$.

The electronic device 110 also includes a controller 116, which includes a memory 115 and a processor 111. When portions of the system and method for suppressing radio frequency radiation are implemented in software, the radio frequency radiation suppression software 120 can be stored in memory 115 and executed by the processor 111, such that the controller 116 supplies a control signal to vary the electrical characteristics of a signal carrying conductor, as will be described below in greater detail.

Frequently, it is desirable to transfer signals from the electronics 114 to elements outside of the electronic device 110. For example, if the electronic device 110 is a digital camera, it may be desirable to connect the digital camera to a computer to transfer image files from the digital camera to the computer. To facilitate external connectivity, the electronics 114 typically includes connector 125 coupled to an interface connector 118 via wiring or signal lines 127, 128 and 129 within the electronic device 114. Further, although omitted for simplicity of illustration, the electronics 114 may also include signal lines and wiring. When coupling the electronic device 110 to external elements, cable 122 connects to interface connector 118 and connector 126. The cable 122 may be, for example, a signal carrying cable, such as an interface cable or a data cable for connecting the electronic device 110 to a computer, or may be a power cable.

The cable 122 includes filter 124. In this example, filter 124 can be a clamp-on or molded-on ferrite device. One manner of suppressing radio frequency radiation that may emanate from the cable 122 is by attaching a ferrite device to a cable 122. However, a ferrite device alone is not optimal for canceling unwanted current generated by a high-frequency signal if a low-frequency signal is also present in the conductor because the current generated by the low-frequency signal tends to saturate the ferrite device.

FIG. 5 is a schematic diagram 130 illustrating a theoretical circuit model of a conductor carrying a high-frequency signal. In this example, the cable 122 of FIG. 4 includes a signal that returns to the electronics 14 via multiple paths 17, 128 and 129. The conductor 127 is used in FIG. 5 only as an example.

When the conductor 127 carries a high-frequency signal, the conductor 127 can be modeled as a transmission line having a distributed inductance and capacitance. The distributed inductance is illustrated using inductors 132, 134, 136 and 138. The distributed capacitance is illustrated using capacitors 131, 133, 137 and 139. Further, the conductor 127 includes characteristic impedance, illustrated using resistor 135. The values of the distributed inductance, capacitance and the characteristic impedance represent the high-frequency behavior of the conductor 127. The model of the conductor 127 shown in FIG. 5 illustrates the possibility of standing current waves existing on a single conductor. Each of the conductors 127, 128 and 129 within the electronic device 110 of FIG. 4 carries a distributed inductance and capacitance as shown in FIG. 5. Merely attaching a filter 124, such as a ferrite device, has limited effectiveness at suppressing high-frequency current because the current generated by the low-frequency signal on the conductor 127 saturates the ferrite device, thereby preventing the ferrite device from limiting any current generated by the high-frequency signal.

FIG. 6 is a graphical illustration 140 showing an example of filter impedance vs. frequency for the filter 124 of FIG. 4. The vertical axis 144 represents resistance (i.e., impedance), increasing upwardly, while the horizontal axis 142 represents frequency, increasing to the right. The curve 146 illustrates that a ferrite device, such as filter 124, has a maximum effectiveness at a single frequency, denoted $\theta_0$. In accordance with an embodiment of the variable filter, the characteristics of the signal conductor are modified to allow a lossy inductive element, such as a toroidal ferrite device, to suppress current, and therefore, radio frequency radiation, generated by a high-frequency signal. By modifying the electrical characteristics of the distributed inductance and, optionally, the resistance, on the conductor 127, the effective frequency range over which a ferrite device can suppress radio frequency radiation is increased.

Figure 7:
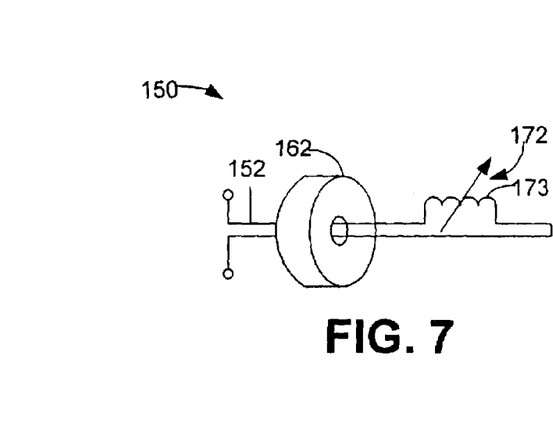
FIG. 7 is a schematic diagram illustrating a first embodiment of a variable filter.

FIG. 7 is a schematic diagram illustrating a first embodiment 150 of a variable filter. The variable filter 150 includes a lossy ferrite device 162 electrically coupled to a conductor 152. The lossy ferrite device 162 may be, for example, inductively coupled to the conductor 152. The conductor 152 includes a variable inductor 172. The variable inductor 172 can be adjusted using, for example, mechanical, electromechanical, or electronic means. By adjusting the electrical characteristics, and particularly, the inductance of the variable inductor 172, and therefore, the inductance of the conductor 152, the amount of low-frequency current flowing in the conductor 152 can be reduced, thereby reducing the possibility that current generated by the low-frequency signal will saturate the ferrite device 162.

By preventing low-frequency saturation of the ferrite device 162, the ferrite device 162 is better able to suppress high-frequency current in the conductor 152, and thereby suppress radio frequency radiation caused by the high-frequency current. In this manner, the electrical characteristics of the conductor are controllably modified to increase the high-frequency suppression effectiveness of the ferrite device 162. By adjusting the electrical characteristics of the conductor 152, the radio frequency radiation cancellation performance of the lossy ferrite device 162 can be adjusted, thereby enabling control of the frequency over which the lossy ferrite device 162 cancels a maximum level of radio frequency energy in the conductor 152.

Current flowing in the conductor 152 produces a magnetic field that circulates around the conductor 152. The magnetic field reorients the micro-domains in the ferrite device 162. The reorienting of the micro-domains creates a changing magnetic field, which produces an electric field that opposes the current in the conductor 152.

The variable inductor 172 allows the distribution of the current at frequency $f_0$ (FIG. 2A) to be tuned so that the net current in the conductor 152 (and in the ferrite device 162) at frequency $f_0$ is close to zero. This virtually eliminates saturation of the ferrite device 162 at frequency $f_0$.

Figure 8:
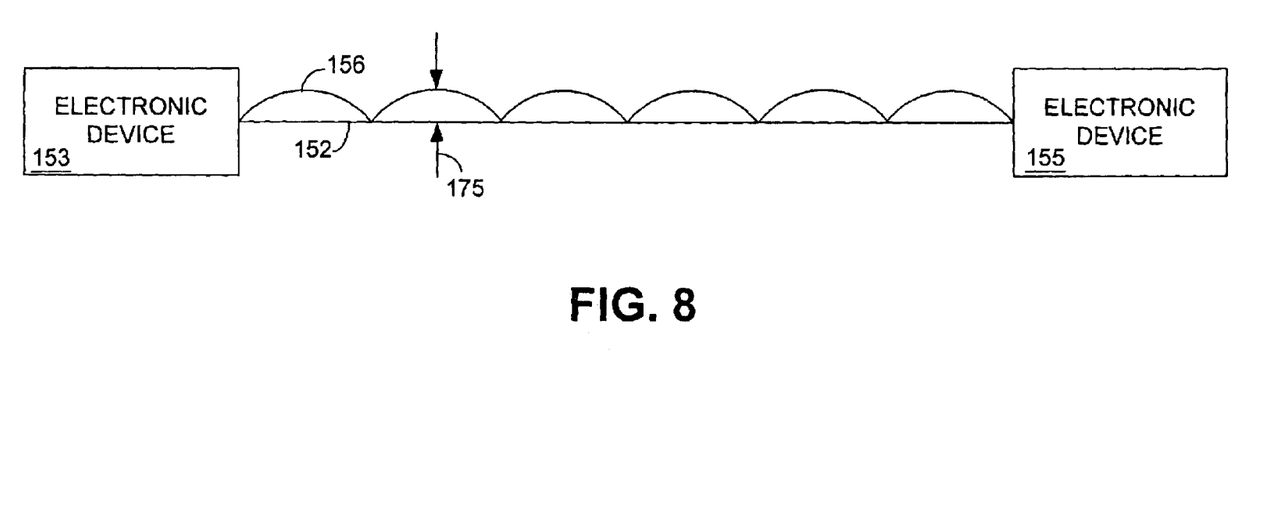
FIG. 8 is a graphical illustration of the current distribution of a conductor at a frequency of $f_1$, where frequency $f_1$ is greater than frequency $f_0$.

FIG. 8 is a graphical illustration of the current distribution of a conductor at a frequency of $f_1$, where frequency $f_1$ is greater than frequency $f_0$. In FIG. 8, the conductor 152 is shown coupling electronic device 153 to electronic device 155. The electronic devices 153 and 155 can be any electronic devices between which a high-frequency signal is exchanged. The trace 156 represents the current at a frequency of $f_1$ flowing in the conductor 152. The maximum amplitude of the current is represented using arrow 175 and is lower than the maximum amplitude of the current associated with frequency $f_0$ (FIG. 2A). Because the frequency $f_1$ is higher than the frequency $f_0$, it is unlikely that the net current at frequency $f_1$ is zero. Therefore, the ferrite device 162 will absorb energy associated with the current at frequency $f_1$, thereby substantially reducing the amount of radio frequency radiation emitted from the conductor 152 at frequency $f_1$.

Figure 9:
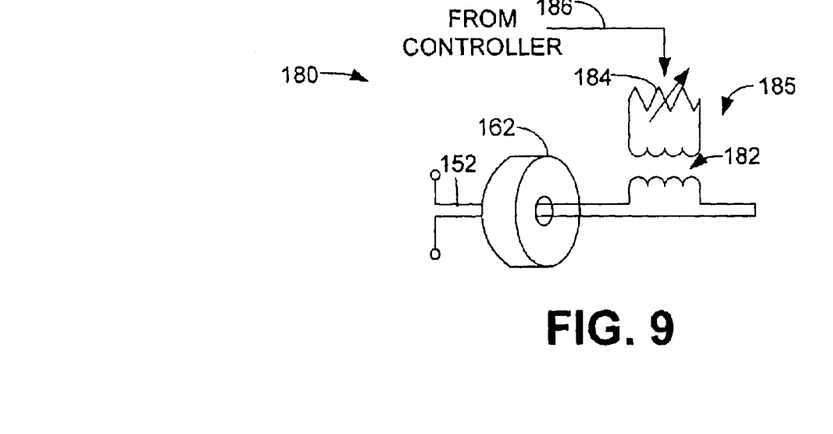
FIG. 9 is a schematic diagram illustrating an alternative embodiment of the filter of FIG. 7.

FIG. 9 is a schematic diagram illustrating an alternative embodiment 180 of the variable filter of FIG. 7. The variable filter 180 includes a fixed inductance 182, and a variable resistance 184. The variable resistance 184 is used to vary the load applied to the conductor 152, and thereby determines the amount of current that flows in the conductor 152 and the electrical characteristics of the conductor 152.

In this example, the variable resistance 184 can be adjusted mechanically, electromechanically, or electronically via a signal from the controller 116 (FIG. 4) via connection 186. For example, under the direction of the radio frequency radiation suppression software 120 (FIG. 4), the controller 116 can supply a signal that controls a transistor circuit, which applies a variable control signal to the variable resistor 184. Furthermore, the controller 116 may execute software that determines the degree to which the variable resistance 184 is adjusted. In this manner, the distributed inductance and resistance on the conductor 152 are varied, thereby adjusting the electrical characteristics of the conductor 152.

By adjusting the electrical characteristics of the conductor 152, the low-frequency current in the conductor 152 can be reduced or virtually eliminated, thereby preventing low-frequency saturation of the ferrite device 162. Regardless of implementation, the embodiments of the variable filter minimize the sum of the low-frequency currents that travel through the lossy ferrite device 162 via the conductor 152 so that electrical saturation of the lossy ferrite device 162 as a result of low-frequency current is minimized. Minimizing low-frequency electrical saturation in the lossy ferrite device 162 allows the lossy ferrite device to attenuate high-frequency current in the conductor 152, and therefore suppress high-frequency radio frequency radiation emitted from the conductor 152.

Figure 10:
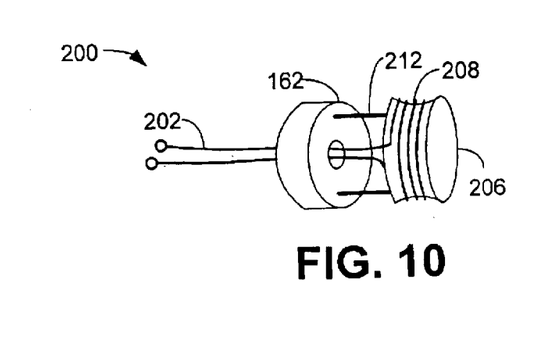
FIG. 10 is a schematic diagram illustrating the construction of a first exemplary embodiment of the variable filter.

FIG. 10 is a schematic diagram illustrating the construction of a first exemplary embodiment of the variable filter. The variable filter 200 includes a lossy ferrite device 162 to which a bobbin 206 is mechanically coupled via connections 212. The bobbin 206 can be attached to the lossy ferrite device 162 using, for example but not limited to, a snap fit, or other mechanical fastening mechanism, into or onto the lossy ferrite device 162. The bobbin 206 includes a number of windings 208 attached and electrically coupled to the conductor 202. The inductance of the conductor 202 can be adjusted by varying the quantity and configuration of the windings 208 so that the electrical characteristics of the conductor 202 can be modified, thereby changing the electrical characteristics of the conductor 202 to reduce or eliminate low-frequency current. By adjusting the electrical characteristics, and particularly, the inductance of the conductor 202, the amount of low-frequency current flowing in the conductor 202 can be reduced, thereby reducing the possibility that current generated by the low-frequency signal will saturate the ferrite device 162. By preventing low-frequency saturation of the ferrite device 162, the ferrite device 162 is better able to suppress high-frequency current in the conductor 202, and thereby suppress radio frequency radiation caused by the high-frequency current. In this manner, the electrical characteristics of the conductor are controllably modified to increase the high-frequency suppression effectiveness of the ferrite device 162.

Figure 11:
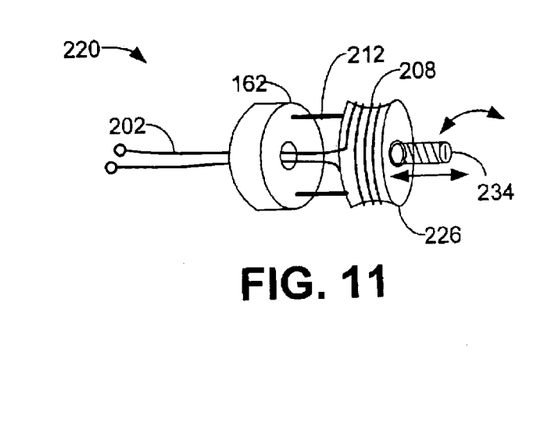
FIG. 11 is a schematic diagram illustrating an alternative embodiment of the variable filter of FIG. 10.

FIG. 11 is a schematic diagram illustrating an alternative embodiment of the variable filter 200 of FIG. 10. The variable filter 220 includes a bobbin 226 adapted to receive a threaded adjusting screw 234. The adjusting screw 234 can be rotated so that it moves axially into and out of the bobbin 226, thereby increasing or decreasing the inductance of the conductor 202 by mechanically altering the relationship between the windings 208 and the conductor 202. In this manner, the inductance of the conductor 202 can be varied so that the electrical characteristics of the conductor 202 can be modified; thereby adjusting the electrical characteristics of the conductor 202 to reduce or eliminate low-frequency current as described above.

Figure 12:
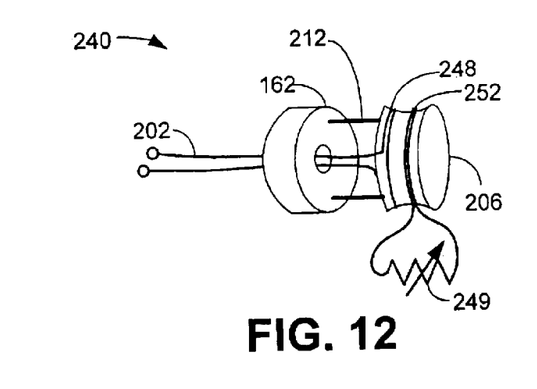
FIG. 12 is a schematic diagram illustrating another alternative embodiment of the variable filter of FIG. 10.

FIG. 12 is a schematic diagram illustrating another embodiment of the variable filter 200 of FIG. 10. The variable filter 240 includes a bobbin 206 that includes primary winding 248 and secondary winding 252. The secondary winding 252 can be constructed to include a variable resistance 249. The variable resistance 249 can be adjusted to vary the load on the conductor 202. In this manner, the inductance of the conductor 202 can be modified so that the electrical characteristics of the conductor 202 can be modified; thereby changing the electrical characteristics of the conductor 202 to reduce or eliminate low-frequency current as described above.

Figure 13:
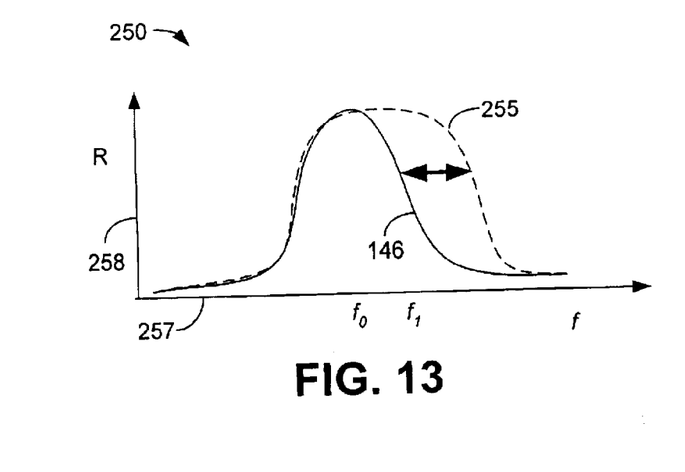
FIG. 13 is a graphical illustration depicting an example result obtained using the embodiments of the variable filter described above.

FIG. 13 is a graphical illustration 250 depicting an example result obtained using the embodiments of the variable filter described above. The vertical axis 258 represents resistance (i.e., impedance), increasing upwardly, and the horizontal axis 257 represents frequency, increasing to the right. The curve 146 centered at frequency $\theta_0$ is reproduced from FIG. 6. However, and in accordance with an embodiment of the variable filter, by modifying the distributed inductance and resistance on a signal-carrying conductor, the low-frequency current in the conductor is reduced, thereby reducing low-frequency saturation in the lossy ferrite device 162. Reducing the low-frequency saturation allows the lossy ferrite device 162 to better reduce current, and therefore radio frequency radiation, caused by higher frequency signals, For example, the curve 255 illustrates the lossy ferrite device 162 having the ability to cancel radio frequency radiation emitted from a conductor centered at frequency $f_1$, where $f_1$ is higher than $f_0$.

While various embodiments of the variable filter have been described, it will be apparent to those of ordinary skill in the art that many more embodiments and implementations are possible that are within the scope of this invention. For example, embodiments of the variable filter can be used to suppress radio frequency radiation in a variety of electronic devices. All such modifications and variations are intended to be included herein within the scope of this disclosure and the present invention and protected by the following claims.

What is claimed is:

1. A system for suppressing radio frequency radiation, comprising:
   a ferrite material inductively coupled to a signal carrier, the signal carrier having current at a first frequency and a second frequency;
   means for reducing saturation of the ferrite material at the first frequency, thereby allowing the ferrite material to suppress current at the second frequency, where the second frequency is higher than the first frequency.

2. The system of claim 1, wherein the means for reducing saturation further comprises means for varying the inductance of the signal carrier.

3. The system of claim 2, wherein the inductance varying means is mechanical.

4. The system of claim 2, wherein the inductance varying means is electro-mechanical.

5. The system of claim 2, wherein the inductance varying means is an electronic control signal.

6. The system of claim 1, wherein the means for reducing saturation further comprises means for inductively coupling the signal carrier to a means for varying the resistance of the signal carrier.

7. The system of claim 6, wherein the resistance varying means comprises a mechanically variable resistor.

8. The system of claim 6, wherein the resistance varying means comprises an electro-mechanically variable resistor.

9. The system of claim 6, wherein the resistance varying means comprises a variable resistor controlled by an electronic circuit.

10. The system of claim 1, wherein means for reducing saturation reduces the current in the signal carrier at the first frequency.

11. A method for suppressing radio frequency radiation, comprising:
    inductively coupling a ferrite material to a signal carrier, the signal carrier having current at a first frequency and a second frequency;
    reducing saturation of the ferrite material at the first frequency, thereby allowing the ferrite material to suppress current at the second frequency, where the second frequency is higher than the first frequency.

12. The method of claim 11, further comprising varying the inductance of the signal carrier.

13. The method of claim 12, further comprising mechanically varying the inductance of the signal carrier.

14. The method of claim 12, further comprising electro-mechanically varying the inductance of the signal carrier.

15. The method of claim 12, further comprising electronically varying the inductance of the signal carrier.

16. The method of claim 11, further comprising inductively coupling the signal carrier to a variable resistance.

17. The method of claim 16, further comprising mechanically varying the resistance to adjust the inductance of the signal carrier.

18. The method of claim 16, further comprising electro-mechanically varying the resistance to adjust the inductance of the signal carrier.

19. The method of claim 16, further comprising electronically varying the resistance to adjust the inductance of the signal carrier.

20. The method of claim 11, wherein reducing saturation of the ferrite material reduces the current in the signal carrier at the first frequency.

21. A variable filter for suppressing radio frequency emission, comprising:
    a ferrite material inductively coupled to a signal carrier, the signal carrier having current at a first frequency and a second frequency, wherein the signal carrier has a variable inductance for adjusting the electrical characteristics of the signal carrier for reducing saturation of the ferrite material at the first frequency, thereby allowing the ferrite material to suppress current at the second frequency, where the second frequency is higher than the first frequency.

22. The filter of claim 21, further comprising an adjustable resistance inductively coupled to the signal carrier, the adjustable resistance configured to vary the electrical characteristics of the signal carrier.

23. The system of claim 21, wherein the variable inductance reduces the current in the signal conductor at the first frequency.

* * * * *